United States Patent [19]
Mooradian

[11] Patent Number: 5,327,444
[45] Date of Patent: Jul. 5, 1994

[54] SOLID STATE WAVEGUIDE LASERS

[75] Inventor: Aram Mooradian, Winchester, Mass.

[73] Assignee: Massachusetts Institute of Technology, Cambridge, Mass.

[21] Appl. No.: 952,952

[22] Filed: Sep. 29, 1992

Related U.S. Application Data

[60] Continuation-in-part of Ser. No. 938,851, Sep. 1, 1992, which is a continuation of Ser. No. 712,185, Jun. 7, 1991, Pat. No. 5,150,374, which is a division of Ser. No. 341,028, Apr. 20, 1989, Pat. No. 5,050,179.

[51] Int. Cl.$^5$ ............................................. H01S 3/19
[52] U.S. Cl. ...................................... 372/44; 372/40; 372/41
[58] Field of Search ...................... 372/35, 40, 41, 44, 372/71

[56] References Cited

U.S. PATENT DOCUMENTS

| | | | |
|---|---|---|---|
| 4,780,877 | 10/1988 | Snitzer | 372/71 |
| 4,791,634 | 12/1988 | Miyake | 372/35 |
| 4,793,675 | 12/1988 | Handa | 350/96.13 |
| 4,856,871 | 8/1989 | Van Sant | 350/253 |
| 4,972,426 | 11/1990 | Steffen | 372/35 |
| 5,050,179 | 9/1991 | Mooradian | 372/44 |
| 5,105,429 | 4/1992 | Mundinger | 372/35 |
| 5,105,430 | 4/1992 | Mundinger | 372/35 |

FOREIGN PATENT DOCUMENTS

| | | |
|---|---|---|
| 56-42389 | 4/1981 | Japan . |
| 58-114338 | 7/1983 | Japan . |
| 61-264777 | 11/1986 | Japan . |
| 63-029330 | 8/1988 | Japan . |
| WO91/12544 | 9/1991 | PCT Int'l Appl. . |

OTHER PUBLICATIONS

"External-Cavity Semiconductor Laser with 1000 GHz Continuous Piezoelectric Tuning Range", Schremer et al., *IEEE Photonics Letters*, vol. 2, No. 1, Jan. 1990, pp. 3–5.

"Miniature Packaged External-Cavity Semiconductor Laser with 50 GHz Continuous Electrical Tuning Range", Mellis et al., *Electronics Letters*, vol. 24, No. 16, Aug. 4, 1988, pp. 988–989.

"Optical Waveguides" by N. S. Kapany and J. J. Burke, Academic Press, New York, Jan. 1972, pp. 301–319.

"High Pressure Waveguide Gas Lasers" P. W. Smith, in Laser Spectroscopy, edited by R. G. Brewer and A. Mooradian, Plenum Press, New York, Jan. 1974, p. 247.

"A Single Mode 2.06 $\mu$m Miniature Laser" by D. Castleberry, H. P. Jenssen and A. Linz, *Digest of Technical Papers on Integrated Optics*, by Opt. Soc. of Amer., pp. MB71–MB72 (1974).

"The Waveguide Laser: A Review", John J. Degnan, *Applied Physics*, vol. 11, 1–33, (1976), pp. 326–358.

*Primary Examiner*—Rodney B. Bovernick
*Assistant Examiner*—Robert E. Wise
*Attorney, Agent, or Firm*—Hamilton, Brook, Smith & Reynolds

[57] ABSTRACT

A solid state waveguide laser system is comprised of a cavity resonator formed of a solid state gain medium extending between input and output surfaces and having a reflectivity medium laterally bounding the gain medium and wherein the index of refraction of the reflectivity medium is greater than that of the gain medium.

40 Claims, 4 Drawing Sheets

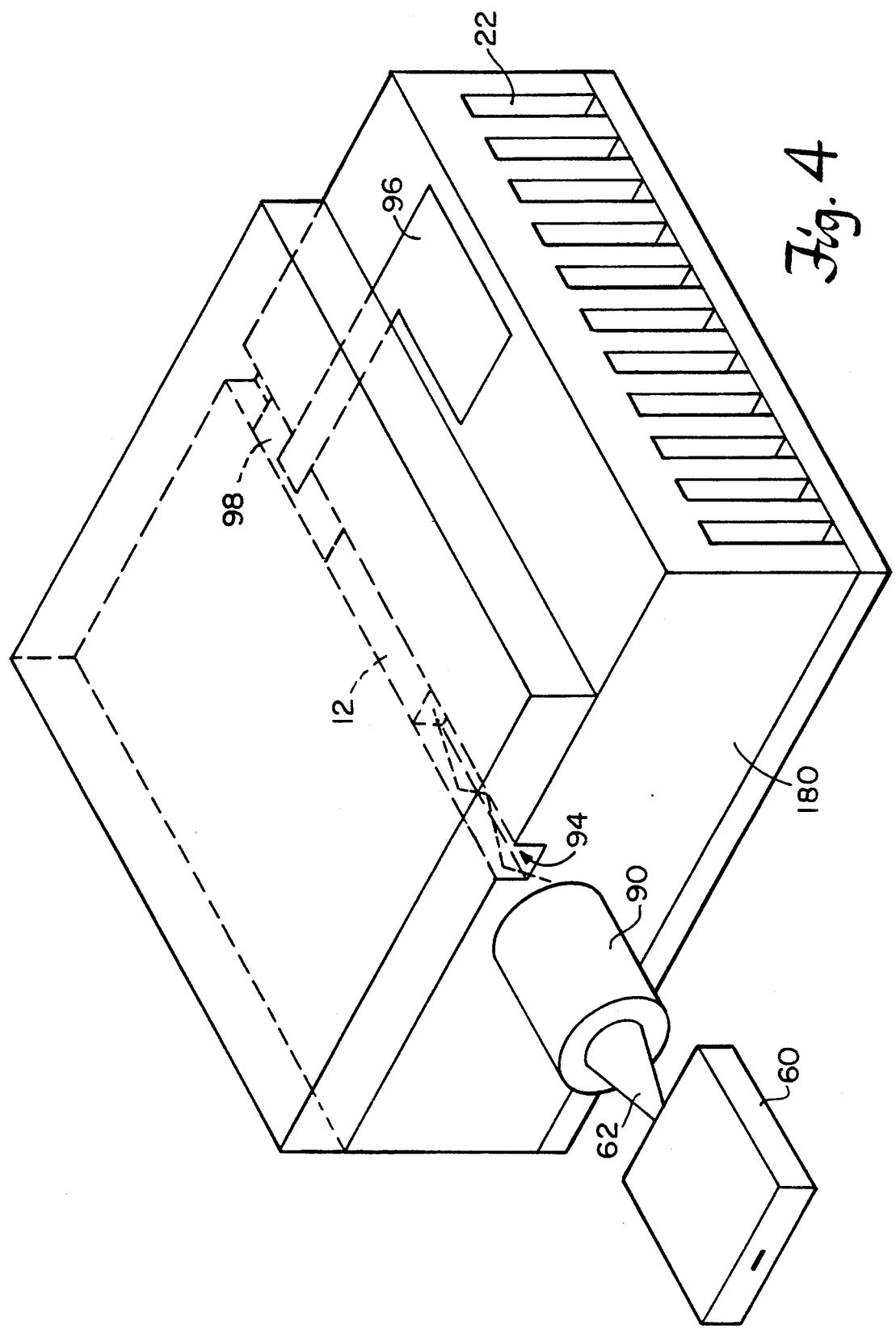

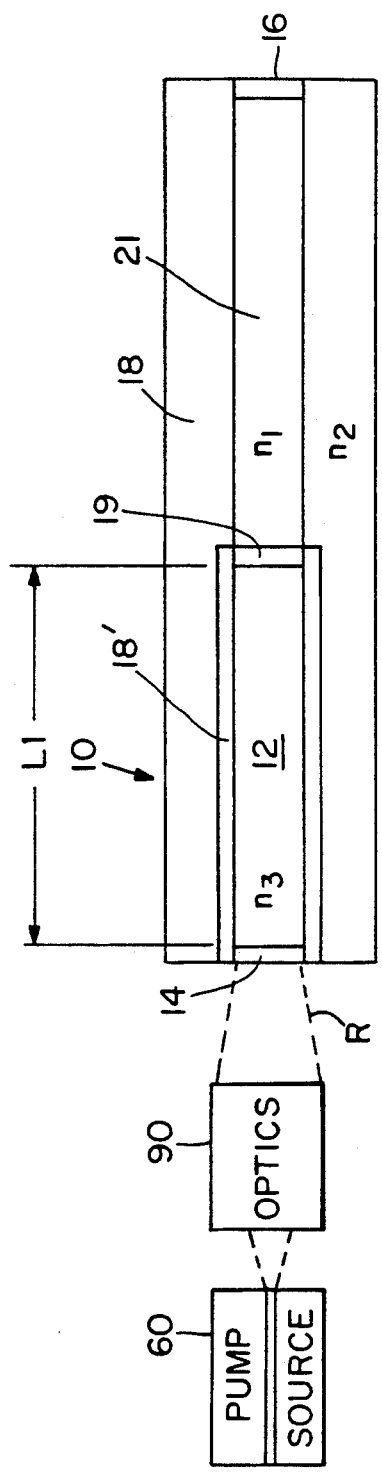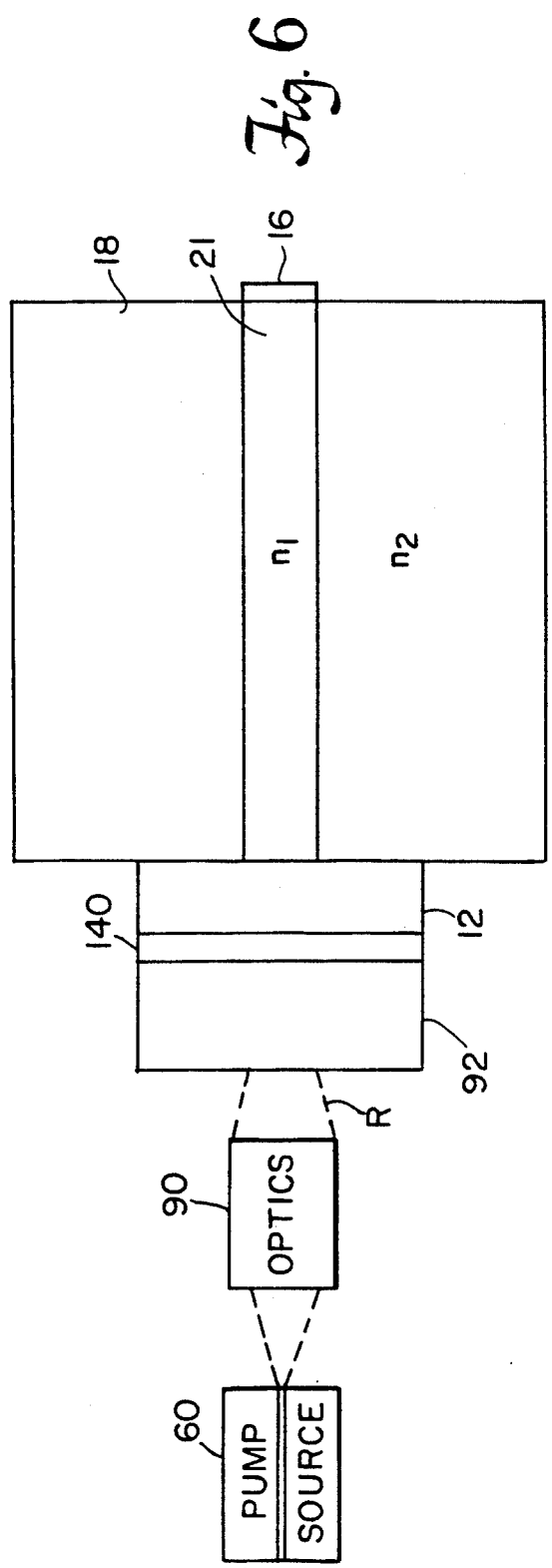

SOLID STATE WAVEGUIDE LASERS

GOVERNMENT FUNDING

The U.S. Government has rights in this invention pursuant to the Contract No. FI9628-85-C-0002 awarded by the Department of the Air Force.

RELATED APPLICATIONS

This is a continuation-in-part of co-pending Ser. No. 07/938,851 filed Sep. 1, 1992 which is a continuation of Ser. No. 712,185, filed on Jun. 7, 1991, now U.S. Pat. No. 5,150,374 issued Sep. 22, 1992 and incorporated herein by reference which is a divisional of Ser. No. 341,028, filed on Apr. 20, 1989, now U.S. Pat. No. 5,050,179, issued Sep. 17, 1991.

BACKGROUND OF THE INVENTION

Many experiments have been carried out that demonstrate the feasibility of lasers in solid state gain material which use a single mode waveguide structure (D. C. Hanna in "Tunable Solid State Lasers" edited by M. L. Shand and H. P. Jenssen, published by the Optical Society of America, Washington, D.C., 1989, pages 340 and 350). The waveguides in these cases are either made in the form of a glass fiber or are produced by diffusion of ions into a gain medium, such as, lithium niobate. Both the pump radiation and the laser radiation are confined to propagate in these single-mode guides with little loss in energy except for the absorption of the pump laser radiation. In addition to these single mode waveguide lasers, multimode waveguide lasers have been demonstrated for the case of gas lasers ("High Pressure Waveguide Gas Lasers" P. W. Smith, in Laser Spectroscopy, edited by R. G. Brewer and A. Mooradian, Plenum Press, New York, 1974, pg. 247. "Wideband Waveguide CO2 Laser", R. L. Abrams, ibid). In a usual single mode fiber optical waveguide, the refractive index of the core is greater than the cladding region in order to confine the wave. In the case of multimode waveguide, this need not be the case. The reflectivity of the surface of the interface is a strong function of the angle of incidence and becomes nearly 100% for grazing incidence. The fundamental spatial mode will propagate with the lowest loss in such a structure. Propagation of modes in such waveguides has been described in "Optical Waveguides" by N. S. Kapany and J. J. Burke, Academic Press, New York, 1972, pages 301-319.

Typical dimensions for such a cavity structure are such that $D^2/\lambda 1 \leq 1$, where D is the width of the cavity resonator, 1 is its length, and $\lambda$ is the wavelength in the resonator medium. In the case of the carbon dioxide gas laser, the guiding structure has been made from beryllium oxide, aluminum oxide, or copper. For these waveguide gas lasers, the refractive index of the gain medium is near unity.

SUMMARY OF THE INVENTION

The present invention pertains to a solid state waveguide laser comprising a resonator formed of a solid state laser gain medium extending longitudinally between input and output mirror surfaces and enclosed on laterally adjacent sides by reflective material having an index of refraction $n_2$ which is greater than the index of refraction $n_1$ of the gain medium material. In a preferred embodiment the waveguide laser is longitudinally pumped by a diode laser or diode laser array and the waveguide laser is cooled by forming microchannels in the reflective material.

BRIEF DESCRIPTION OF THE DRAWINGS

FIG. 4 is a schematic perspective view of a modulated/frequency converted solid state waveguide laser.

FIG. 5 is a plan view of an alternate embodiment of the waveguide laser of FIG. 1.

FIG. 6 is an alternate embodiment of FIG. 5.

DETAILED DESCRIPTION OF THE INVENTION

Figure 1:
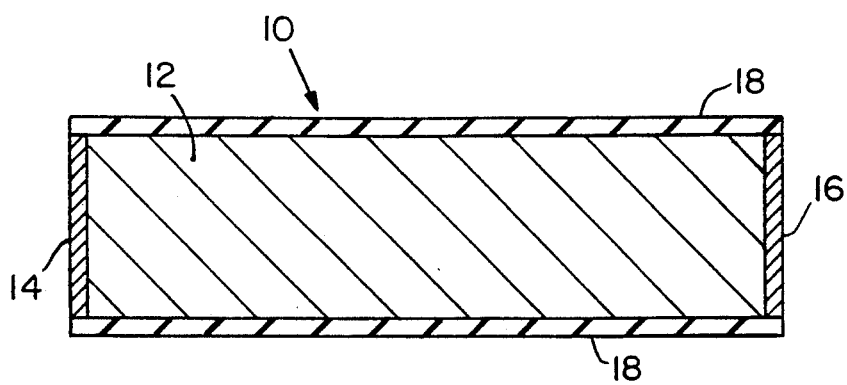
FIG. 1 is a schematic plan view of a solid state waveguide laser.

Referring now to FIG. 1 the solid state waveguide laser 10 may be seen to comprise a solid state laser material 12 in which the entire resonator i.e. gain medium portion between input mirror 14 and output coupler 16 or parts of the resonator are comprised of the laser gain material itself. The gain medium 12 is bounded on lateral sides by a reflective, or cladding, material 18 having an index of refraction $n_2$ greater than the index of refraction $n_1$ of the gain medium 12. The cavity dimensions preferably comply with the formula $D^2/\lambda 1 \leq 1$ wherein D is the cross-sectional width of the cavity resonator, l is cavity length and $\lambda$ is the wavelength as shown in FIG. 1. For the case of the solid state material Nd:YAG in which there can be typical absorption lengths from a few millimeters to more than a centimeter, the cross sectional width, D, of the resonator would be about 100-300 micrometers. Structures with this size of cross section would allow efficient heat extraction when the gain material is bonded to the heat sink using a structure such as that shown in FIGS. 2 and 3.

Figure 2:
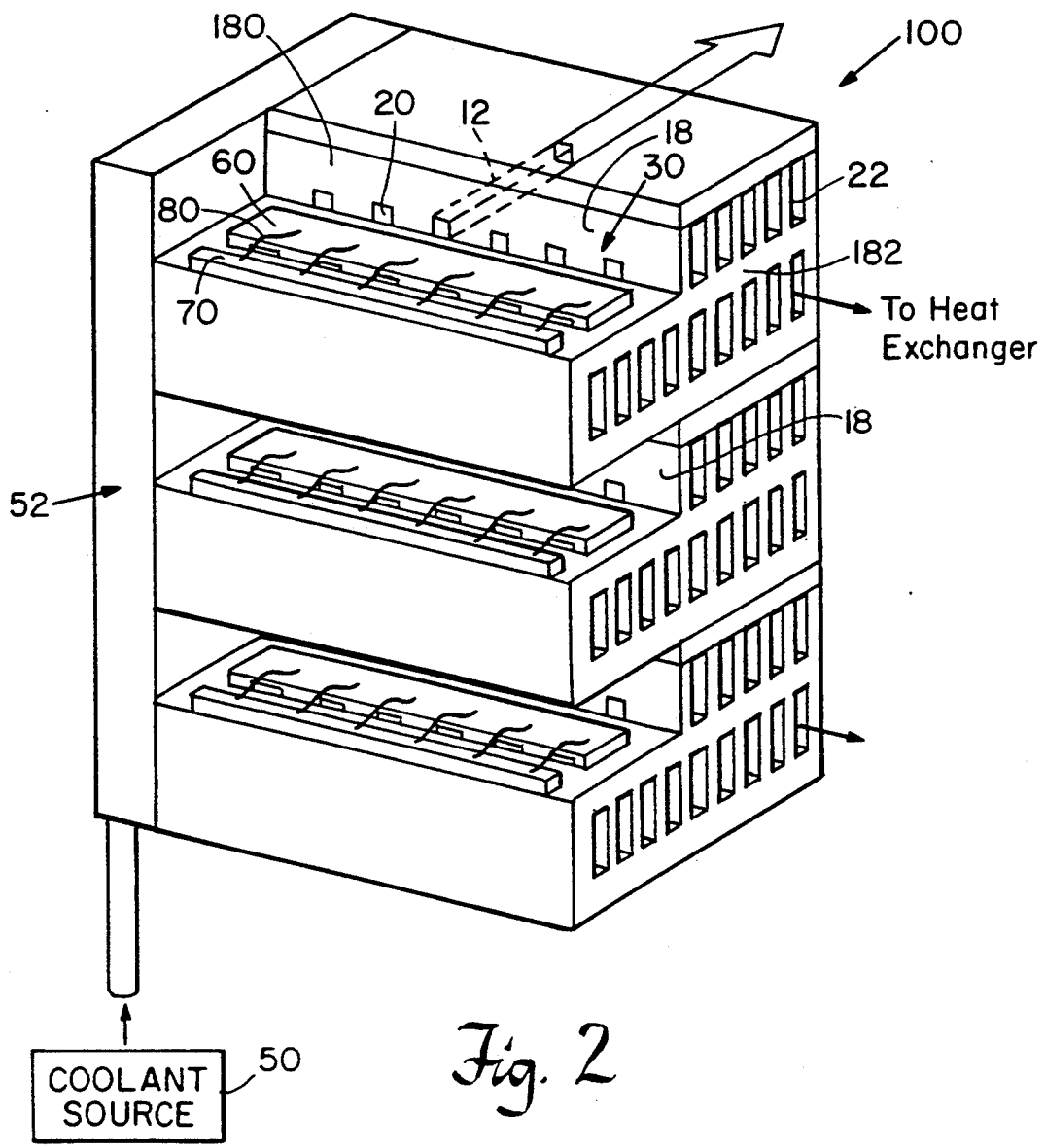
FIG. 2 is a schematic prospective view of a two-dimensional array of solid state waveguide lasers.
Figure 3:
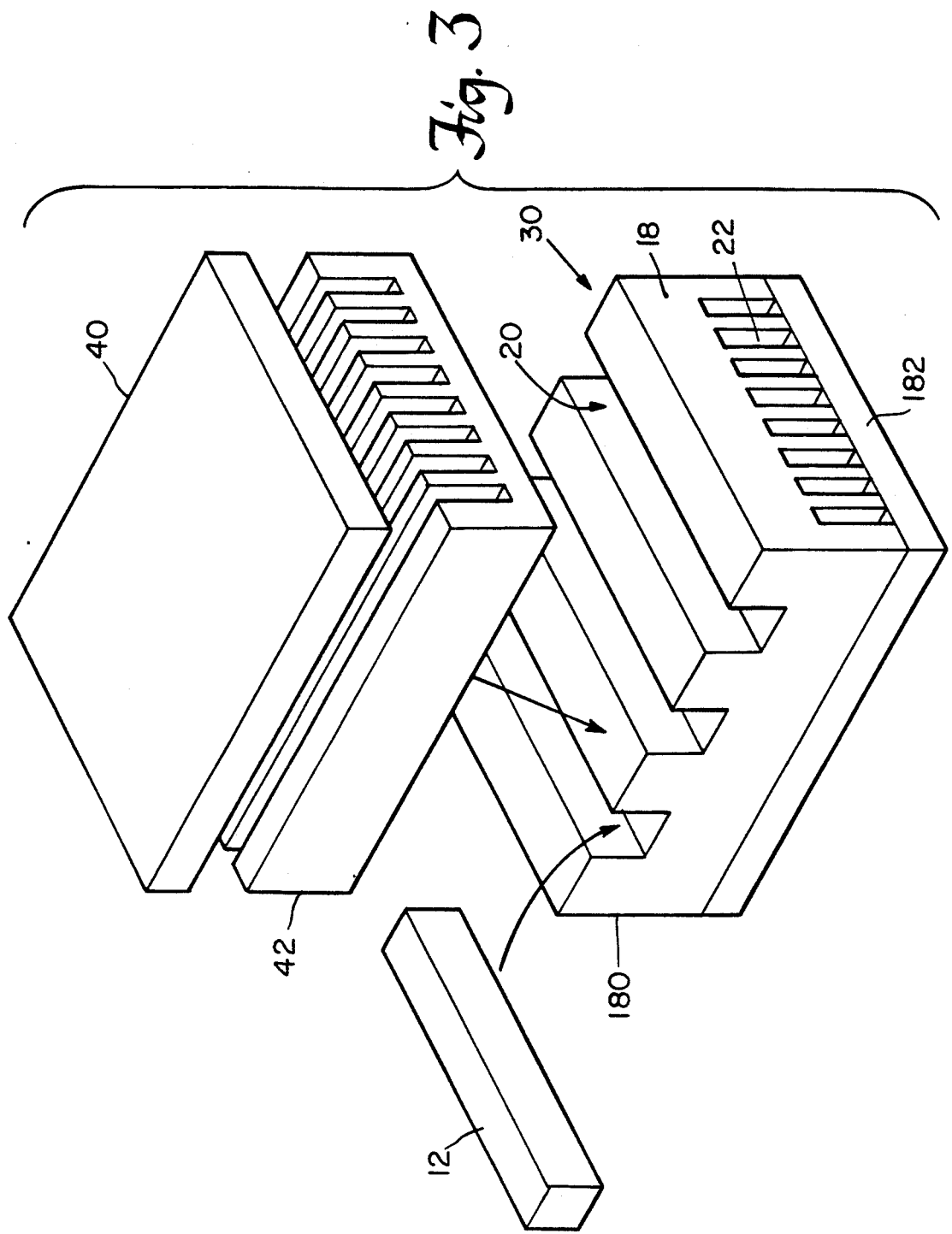
FIG. 3 is an exploded schematic prospective view of a protein of FIG. 1 showing details of the heat sink assembly.

In FIGS. 2 and 3 the solid state waveguide laser 10 of FIG. 1 is used to form a two-dimensioned array 100 with microchannel cooling. Solid state linear waveguide laser arrays 30 are formed comprising, for example, Neodymium YAG or other suitable gain material 12 disposed in slots 20 formed in silicon reflective, or cladding material 18. Microchannels 22 are formed transverse the longitudinal direction of the gain material 12 for the introduction of a coolant fluid. The silicon reflective material 18 is formed into a slab 18a which may be bonded to an underlying substrate 182 formed, for example, of glass, silicon, or sapphire. An additional silicon microchannel slab 42 may be formed and bonded to the linear array 30 with a top slab 40 of silicon bonded thereto as shown in FIG. 3. Coolant (air or liquid) is supplied from source 50 (FIG. 2) to manifold 52 and distributed through channel 22 to a heat-exchanger (not shown) and back to source 50. Linear arrays 30 with microchannel slabs 180 may be stacked upon each other to form the 2D array 100 of FIG. 2. Each solid state waveguide laser gain medium 12 is end-pumped by a diode laser or diode laser array 60 bonded to, or integrated in, the silicon slab 180. Alternatively, the pump diodes may be located remotely and coupled to the gain medium by optics, such as a fiber. Drive circuits 70 may also be formed on, or bonded to, slab 18 for energizing individual diode arrays 60 in response to off-chip commands from a central processor (not shown). The drive circuits 70 may be coupled to the diode arrays 60 by external wire leads 80 as shown or by printed wires on silicon slab 18. Suitable input and output mirrors (not shown) are formed on the ends of the gain material as in FIG. 1.

End pumping using a diode laser of laser array has the advantage of total and spatially uniform absorption of the pump laser radiation in the waveguide cavity 20 with the aid of total internal reflection, thus assuring the maximum spatial overlap with the laser mode for maximum laser efficiency. This is in contrast to the more conventional end pumping configurations in which there must be matching between the spatial modes of the pump and output laser beam for efficient extraction of pump energy to occur.

As shown in FIG. 4, the solid state laser may also be applied to nonlinear materials and electrooptic materials for use in the same type of waveguide configuration. In an ordinary nonlinear conversion geometry, a Gaussian beam is focussed into a nonlinear material or a single mode waveguide having the dimension of a few wavelengths of light. In the first case, for non-critical phase-matching, the nonlinear conversion is maximum when the length of the nonlinear material is several Fresnel lengths. In the case of the single mode waveguide, the interaction length can be significantly longer. In multimode waveguides, a plane wave can be confined to propagate over distances longer than the Fresnel length that corresponds to the width of the waveguide in the same way as described for the waveguide laser. This leads to a greater nonlinear conversion efficiency than would occur in the simple case of focusing into a nonlinear material where the material length is more than several Fresnel lengths. Such waveguide structures could be made a part of the waveguide laser resonator or could be placed in series with the output of the laser as is shown in FIG. 4 wherein the pumping light 62 from a diode laser or array 60 is focused by a microlens 90 onto a waveguide structure 94 in which solid state gain material 12 is disposed between silicon reflective material 18 in which transversely extending coolant microchannels 22 are formed. Non-linear or modulator material 98 is also disposed within waveguide 94 and a bonding pad 96 is formed on slab 180 to enable modulation or excitation voltages to be applied to material 94.

In order to maximize the heat removal from such waveguide structure, it can be placed in a tight fitting holder made from a compatible material such as silicon. In the case of single crystal silicon, there are several additional advantages. When glass of the appropriate type is used as the laser host material, a particularly efficient method of bonding can be used in which an electric field is applied between the glass laser material and the silicon slab 180 at an elevated temperature. Strong bonding between the atoms in both materials occurs leading to a very good thermal heat sink. As previously noted, the silicon 18 can have coolant microchannels 22 cut or etched into the structure for efficient heat removal. Higher power cw/average power glass lasers can be made this way than could otherwise have been obtained using conventional pumping geometries. The refractive index of silicon is about 3.4 while that of glass is 1.5 and YAG is nearly 2. Such a combination would be appropriate for a waveguide laser of the invention.

In the case when glass is used as the host material, the glass waveguide structure may also be fabricated by pulling a rectangular fiber through a die using the same method as that for manufacture of glass fibers. The dimensions of this rectangular fiber can be accurately matched to the rectangular groove cut into the heat sink material.

The advantage of the two dimensional arrays is greatly increased output power and the ability to control the operation of each of the lasers by incorporating control circuits onto the silicon itself. All of the well known methods of modifying the laser beam, such as nonlinear frequency conversion modulation, Q-switching, etc., can be carried out in this waveguide configuration.

Where the refractive index of the cladding or reflective material 18 is greater than that of the gain medium 12, there is a loss of pump radiation energy that occurs as the angle of internal reflection increases from near grazing. The fraction of energy that is not reflected is transmitted into the cladding region and is not available to pump the gain region. This will, in general, reduced to some degree the overall efficiency of the laser system.

An alternative embodiment of the invention, as shown in FIG. 5, eliminates the loss of pump energy and at the same time uses the concept of the grazing incidence waveguide laser. In FIG. 5, the gain material 12 is contained in a region which has a cladding material that has a lower refractive index than that of the gain region or as shown in FIG. 5 is clad with a material 181 which has a 100% reflectivity at all angles of incidence such as a metal like gold, chromium, etc. The length of the gain region $L_1$ is chosen to substantially absorb all of the pump radiation R from pump diode or diode array 60 which is coupled by optics 90, such as a lens or fiber lens 90 to input mirror 14. The opposite end of the gain region 12 is polished flat and antireflection coated 19 at the laser wavelength of the gain medium 12. An output guiding region 21 formed of a high refractive index $n_1$ material such as silicon is then abutted to the gain region 12 to complete the waveguide cavity and an output mirror 16 formed on the end of region 12 in the manner previously described above. In this second section 21 the spatial mode discrimination occurs in the manner described above to insure operation in the fundamental spatial mode. Note that, as above, a reflective medium 18 laterally encloses the gain medium 12 and guiding region 21 and the index of refraction $n_3$ of the gain region and the index of refraction of the guiding region $n_1$ is less than the index of refraction $n_2$ of the reflective medium. Also, microchannels (not shown) may be formed in the reflective medium.

Where the absorption length of the gain medium 12 is short enough so that internal guiding of the pump radiation from source 60 is not required (typically less than a few times the transverse dimension of the cavity, D), the gain medium 12 may be bonded directly to the end of the waveguide medium 21 as shown in FIG. 6. An input surface 140 is formed on the gain medium 12 having a low reflectivity at the wavelength of the pump and a high reflectivity at the wavelength of the gain medium. The pump radiation R in this case may be focussed with fast optics 90 or fibers into the gain medium 12 through an optional transparent heat sink 92.

Lasing materials that would be appropriate for this arrangement would include stoichiometric solid state laser material such as Yb:YAG, Nd or Er:pentaphosphate, heavily doped Nd or Er:glass or semiconductor laser material in either bulk or quantum well format. When the high absorption laser material 12 is bonded next to the grazing incidence waveguide cavity material 21, as shown on FIG. 6, the loss of the laser cavity mode energy is not sufficient to prevent laser oscillation or significantly reduce the external efficiency. The slight diffraction loss associated with propagation in this region is small since this distance is significantly smaller than the total length of the cavity. If a semiconductor gain element is used as the gain medium only a single frequency would oscillate when the device is operated in a single transverse mode according to the published work of Flemming and Mooradian (IEEE Journal of Quantum Electronics, 1989). Operation of the semiconductor or other highly absorbing laser material gain element at one end of the laser cavity will further help to insure single frequency operation since this would reduce the effects of spatial hole burning. In the case of the semiconductor quantum well laser gain material, the position and number of quantum wells must be such that they occur at an antinode of the standing wave in the laser cavity. This would not be difficult to implement in practice.

The advantages of using semiconductor laser gain materials in such a system is the broad bandwidth obtained for the pump laser radiation and the ability to tune the output wavelength over a large wavelength range (>20 nm per device). Such lasers may be modulated directly by modulating the pump laser 60 up to the cavity response time. Frequency doubling the output from such a laser as described above would make this laser useful for display and optical disc read and write applications.

Equivalents

Those skilled in the art will recognize, or be able to ascertain, using no more than routine experimentation, many equivalents to specific embodiments of the invention described herein.

These and all other equivalents are intended to be encompassed by the following claims.

I claim:

1. A solid state waveguide laser comprising:
   a) a solid state laser gain material having a cross-sectional width D, and length 1 and index of refraction $n_1$;
   b) a reflective material having an index of refraction $n_2$ extending along the length of said gain material and wherein $n_2 > n_1$; and
   c) input and output surfaces formed on the opposite ends of the gain material.

2. The laser of claim 1 wherein the gain material, reflective material and surfaces form a resonator adapted to be optically pumped to produce laser radiation in the gain material at a wavelength λ and wherein $D^2$ divided by λ times the length 1 of the gain material is equal to or less than one.

3. The laser of claim 1 wherein the reflective material is formed of material from the group comprising silicon, glass or sapphire.

4. The laser of claim 3 wherein fluid cooling channels are formed in the reflective material.

5. An array of solid state waveguide lasers comprising:
   a) a slab of reflective material having an index of refraction $n_2$ with slots formed therein extending along a longitudinal axis thereof;
   b) a body of solid state gain material disposed in said slots and having an index of refraction $n_1$ and wherein $n_2$ is greater than $n_1$;
   c) an input and an output surface on respective opposite ends of the body; and
   d) a linear array of pump diodes disposed opposite the input surface for generating light which is coupled to said gain material to cause the material to lase.

6. The array of claim 5 including fluid cooling channels formed in said reflective material and extending transverse said longitudinal axis.

7. The array of claim 6 including a fluid manifold at one end of said channels coupled to a source of coolant.

8. The array of claim 5 wherein the reflective material is formed of silicon.

9. The array of claim 8 wherein driver circuits for energizing said pump diodes are formed in said silicon.

10. The array of claim 5 including non-linear material disposed in said slots.

11. The array of claim 5 including electro-optic material disposed in said slots.

12. A solid state waveguide laser system comprising:
    a) a pumping device for generating pumping light;
    b) a solid state gain medium having an input surface at a first end thereof and an output surface at a second end thereof;
    c) optical means for coupling pumping light from the pumping device onto said input surface; and
    d) a reflective medium enclosing said gain medium on lateral sides thereof, said reflective medium having an index of refraction greater than the index of refraction of said gain medium.

13. The system of claim 12 further including a guiding region of high index of refraction abutting the output surface.

14. The system of claim 13 wherein the gain medium is laterally enclosed by a material having substantially 100% reflectivity at all angles of incidence.

15. A laser system comprising:
    a) a gain region having a gain medium;
    b) pump means for longitudinally pumping the gain medium with light to cause the gain medium to lase;
    c) a surface on an end of the gain medium nearest the pump means having a low reflectivity at the wavelength of the pump light and high reflectivity at the lase wavelength;
    d) a guide region having a body of material having an index of refraction $n_1$ disposed at an end of the gain medium furthest from the pump means; and
    e) a reflectivity region around the guide region having an index of refraction $n_2$ which is greater than $n_1$.

16. The system of claim 15 wherein the gain medium is a solid state material.

17. The system of claim 15 wherein the gain medium is a semiconductor material.

18. The system of claim 15 wherein the gain medium comprises a quantum well semiconductor device.

19. The system of claim 15 including a transparent heat sink adjacent said gain medium.

20. The system of claim 15 wherein the reflectivity region is formed of silicon.

21. A method of forming a solid state waveguide laser comprising the steps of:
    a) a solid state laser gain material having a cross-sectional width D, length 1 and index of refraction $n_1$;
    b) a reflective material having an index of refraction $n_2$ extending along the length of said gain material and wherein $n_2 > n_1$; and c) input and output surfaces formed on opposite ends of the gain material.

22. The method of claim 21 wherein the gain material, reflective material and surfaces form a resonator adapted to be optically pumped to produce laser radiation in the gain material at a wavelength $\lambda$ and wherein $D^2$ divided by $\lambda$ times the length 1 of the gain material is equal to or less than one.

23. The method of claim 21 wherein the reflective material is formed of material from the group comprising silicon, glass or sapphire.

24. The method of claim 23 wherein fluid cooling channels are formed in the reflective material.

25. The method of forming an array of solid state waveguide lasers comprising the steps of:
   a) forming a slab of reflective material having an index of refraction $n_2$;
   b) forming slots in the slab extending along a longitudinal axis thereof;
   c) disposing a body of solid state gain material in said slots, said body having an index of refraction $n_1$ and wherein $n_2$ is greater than $n_1$;
   d) forming input and an output surfaces on respective opposite ends of the body; and
   e) disposing a linear array of pump diodes opposite the input surface for generating light which is coupled to said gain material to cause the material to lase.

26. The method of claim 25 including forming fluid cooling channels in said reflective material extending transverse said longitudinal axis.

27. The method of claim 26 including forming a fluid manifold at one end of said channels and coupling said manifold to a source of coolant.

28. The method of claim 25 wherein the reflective material is formed of silicon.

29. The method of claim 28 including forming driver circuits in the silicon for energizing said pump diodes.

30. The method of claim 25 including disposing non-linear material in said slots.

31. The method of claim 25 including disposing electrooptic material in said slots.

32. A method of forming a solid state waveguide laser system comprising the steps of:
   a) providing a pumping device for generating pumping light;
   b) forming a solid state gain medium;
   c) forming an input surface at a first end of the gain medium;
   d) forming an output surface at a second end of the gain medium;
   e) coupling light from the pumping device onto said input surface; and
   f) enclosing said gain medium on lateral sides thereof with a reflective medium having an index of refraction greater than the index of refraction of said gain medium.

33. The method of claim 32 further including forming a guiding region of high index of refraction abutting the output surface.

34. The method of claim 33 including laterally enclosing the gain medium by a material having substantially 100% reflectivity at all angles of incidence.

35. A method for forming a laser system comprising the steps of:
   a) forming a gain region having a gain medium;
   b) providing a light pump means for longitudinally pumping the gain medium with light to cause the gain medium to lase;
   c) forming a surface on an end of the gain medium nearest the pump means having a low reflectivity at the wavelength of the pump light and high reflectivity at the lase wavelength;
   d) forming a guide region from a body of material having an index of refraction $n_1$ and disposing the body at an end of the gain medium furthest from the pump means; and
   e) forming a reflectivity region around the guide region having an index of refraction $n_2$ which is greater than $n_1$.

36. The method of claim 35 wherein the gain medium is a solid state material.

37. The method of claim 35 wherein the gain medium is a semiconductor material.

38. The method of claim 35 wherein the gain medium comprises a quantum well semiconductor device.

39. The method of claim 35 including a transparent heat sink adjacent said gain medium.

40. The method of claim 35 wherein the reflectivity region is formed of silicon.

* * * * *